(12) United States Patent
Jin et al.

(10) Patent No.: US 10,784,464 B2
(45) Date of Patent: Sep. 22, 2020

(54) INORGANIC FILM AND ENCAPSULATING FILM

(71) Applicant: Wuhan China Star Optoelectronics Semiconductor Display Technology Co., Ltd., Wuhan, Hubei (CN)

(72) Inventors: Jiangjiang Jin, Shenzhen (CN); Hsiang-lun Hsu, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 403 days.

(21) Appl. No.: 15/735,529

(22) PCT Filed: Nov. 23, 2017

(86) PCT No.: PCT/CN2017/112631
§ 371 (c)(1),
(2) Date: Dec. 11, 2017

(87) PCT Pub. No.: WO2019/061770
PCT Pub. Date: Apr. 4, 2019

(65) Prior Publication Data
US 2020/0035945 A1    Jan. 30, 2020

(30) Foreign Application Priority Data

Sep. 28, 2017   (CN) .......................... 2017 1 0915590

(51) Int. Cl.
*H01L 51/52*    (2006.01)
(52) U.S. Cl.
CPC .... *H01L 51/5253* (2013.01); *H01L 2251/303* (2013.01)

(58) Field of Classification Search
CPC ...................... H01L 51/5253; H01L 2251/303
See application file for complete search history.

(56) References Cited

U.S. PATENT DOCUMENTS 7,255,937 B2    8/2007  Park et al.
7,265,807 B2    9/2007  Lifka et al.
(Continued)

FOREIGN PATENT DOCUMENTS

| CN | 104143609 A | 11/2014 |
|----|-------------|---------|
| CN | 104518113 A | 4/2015  |
| CN | 107068904 A | 8/2017  |

OTHER PUBLICATIONS

Meyer et al., The origin of low water vapor transmission rates through Al2O3/ZrO2 nanolaminate gas-diffusion barriers grown by atomic layer deposition; Appl. Phys. Lett. 96, 243308; published Jun. 17, 2010.*

*Primary Examiner* — Peniel M Gumedzoe
(74) *Attorney, Agent, or Firm* — Hemisphere Law, PLLC; Zhigang Ma

(57) ABSTRACT

The disclosure discloses an inorganic film applied for thin film encapsulation of an OLED device. The inorganic film includes inorganic layer units including a first inorganic layer, a second inorganic layer, and a third inorganic layer located between the first inorganic layer and the second inorganic layer, and the third inorganic layer is formed by reacting the first inorganic layer with the second inorganic layer. The inorganic film is used in the thin film encapsulation of the OLED device, which can improve the ability of the device to block the water and oxygen and improve the product quality.

16 Claims, 2 Drawing Sheets

(56) References Cited

U.S. PATENT DOCUMENTS

| | | |
|---|---|---|
| 9,252,392 B2 | 2/2016 | Kumar et al. |
| 2010/0112270 A1* | 5/2010 | Bulliard .................. C09J 7/387 428/76 |
| 2014/0147684 A1 | 5/2014 | Kwak et al. |
| 2015/0090995 A1* | 4/2015 | Jung .................. H01L 51/5253 257/40 |
| 2016/0164013 A1 | 6/2016 | Lee |
| 2016/0276627 A1* | 9/2016 | Xiao .................. H01L 51/5259 |
| 2016/0365537 A1 | 12/2016 | Qian |

* cited by examiner

INORGANIC FILM AND ENCAPSULATING FILM

RELATED APPLICATIONS

The present application is a National Phase of International Application Number PCT/CN2017/112631, filed Nov. 23, 2017, and claims the priority of China Application No. 201710915590.4, filed Sep. 28, 2017.

FIELD OF THE DISCLOSURE

Organic light-emitting diode (OLED) has the advantages such as self-luminousness, wide temperature range, fast response, and bendable folding, so it is called the third-generation display technology. At present, the common promotion of industry and academia as well as the continuous increase of market demand make the popularization speed of OLED continuously accelerating. OLED products such as smart terminals and wearable devices have been widely used in life.

However, organic materials used in OLEDs are particularly sensitive to water and oxygen, and are very easy to react with the infiltrating water vapor and affect charge injection. In addition, the infiltration of water vapor and oxygen will also react with organic materials. These reactions are the main factors that cause the performance of OLED devices to decline and the lifetime of OLED devices to shorten. Therefore, OLED devices require tight encapsulating materials to protect them from water and oxygen. The existing OLED devices have a variety of encapsulating methods, such as thin film encapsulation (TFE), glass encapsulating, and frit encapsulating. Especially in the field of flexible display, thin film encapsulation is considered as an indispensable condition for future flexible electronic products.

The prior art discloses a moisture barrier composite film and an encapsulating structure, and the composite film includes an organic-inorganic alternating structure including a plurality of organic protective layers and a plurality of inorganic layers. However, the encapsulating effect of the composite film is ordinary, and the capacity thereof to block water and oxygen capacity needs to be improved.

BACKGROUND

Liquid crystal displays are widely applied due to numerous advantages such as thin bodies, energy saving, radiation-free, etc. Most liquid crystal displays available on the market are backlight-type liquid crystal displays, and such liquid crystal display includes a liquid crystal panel and a backlight module. The working principle of the liquid crystal panel is placing liquid crystal molecules between two parallel glass substrates and loading a driving voltage on the two glass substrates to control rotation directions of the liquid crystal molecules, for refracting rays of the backlight module to generate images.

SUMMARY

A technical problem to be mainly solved by the disclosure is to provide an inorganic film and an encapsulation film, which can improve the ability of the device to block the water and oxygen and improve the product quality.

To solve the technical problem, the first technical proposal of the disclosure is to provide an inorganic film applied for thin film encapsulation of an OLED device, and the inorganic film includes N inorganic layer units, and N is a natural number and N is not more than 10; the inorganic layer units include a first inorganic layer, a second inorganic layer, and a third inorganic layer located between the first inorganic layer and the second inorganic layer, and the second inorganic layer includes $ZrO_2$ and the first inorganic layer includes a non-$ZrO_2$ oxide; the third inorganic layer is formed by reacting the first inorganic layer with the second inorganic layer.

To solve the technical problem, the second technical proposal of the disclosure is to provide an inorganic film, applied for thin film encapsulation of an OLED device, the inorganic film includes inorganic layer units including a first inorganic layer, a second inorganic layer, and a third inorganic layer located between the first inorganic layer and the second inorganic layer, and the third inorganic layer is formed by reacting the first inorganic layer with the second inorganic layer.

To solve the technical problem, the third technical proposal of the disclosure is to provide an encapsulating film, applied for thin film encapsulation of an OLED device, the encapsulating film includes a buffer layer and a first barrier layer, the first barrier layer covers the OLED device, and the buffer layer covers the first barrier layer; the first barrier layer includes the inorganic film as described above.

The beneficial effect of the disclosure is that the inorganic film of the disclosure applied for thin film encapsulation of an OLED device can be used as an OLED encapsulation layer. The inorganic film includes inorganic layer units including a first inorganic layer and a second inorganic layer, and the first inorganic layer and the second inorganic layer react to form a third inorganic layer between the first inorganic layer and the second inorganic layer. The inorganic film of the disclosure can obviously improve the water and oxygen blocking capability of the device and improve the product quality.

DETAILED DESCRIPTION OF PREFERRED EMBODIMENTS

The disclosure provides an inorganic film and an encapsulating film. In order to make the objectives, technical solutions and technical effects of the disclosure dearer and clearer, the disclosure is further described in detail below, and it should be understood that the specific implementation examples described herein are merely used to explain the disclosure, but not used to limit the disclosure.

The disclosure provides an inorganic film including an inorganic layer unit, and the inorganic layer units include a first inorganic layer, a second inorganic layer, and a third inorganic layer located between the first inorganic layer and the second inorganic layer. Here, it should be noted that the third inorganic layer is formed by reacting the first inorganic layer with the second inorganic layer.

Specifically, the first inorganic layer includes a non-$ZrO_2$ oxide, such as a metal oxide or non-metal oxide of $Al_2O_3$, $SiO_2$, and $TiO_2$; and the second inorganic layer includes $ZrO_2$. In one of the embodiments, the first inorganic layer includes $Al_2O_3$ and the second inorganic layer includes $ZrO_2$, and a third inorganic layer with ultra-thinness and high density is formed at the contact interface of the first inorganic layer and the second inorganic layer, and the third inorganic layer includes $ZrAlxOy$. The third inorganic layer has a good ability to block the water and oxygen.

The inorganic film in the disclosure is applied for the thin film encapsulation of an OLED device, and a thickness of the inorganic film has a certain influence on the ability of the OLED device to block the water and oxygen. In order to achieve a better water and oxygen blocking effect, in one of the embodiments, the thickness of the inorganic film ranges from 1 nm to 200 nm. In another embodiment, a thickness of the first inorganic layer ranges from 1 nm to 100 nm and a thickness of the second inorganic layer ranges from 1 nm to 5 nm.

Further, a number of the inorganic layer units included in the inorganic film of the disclosure may be 1, 3 or 5, it is only necessary that the number of included inorganic layer units should be no more than 10 and can be designed according to the actual situation.

Figure 1:
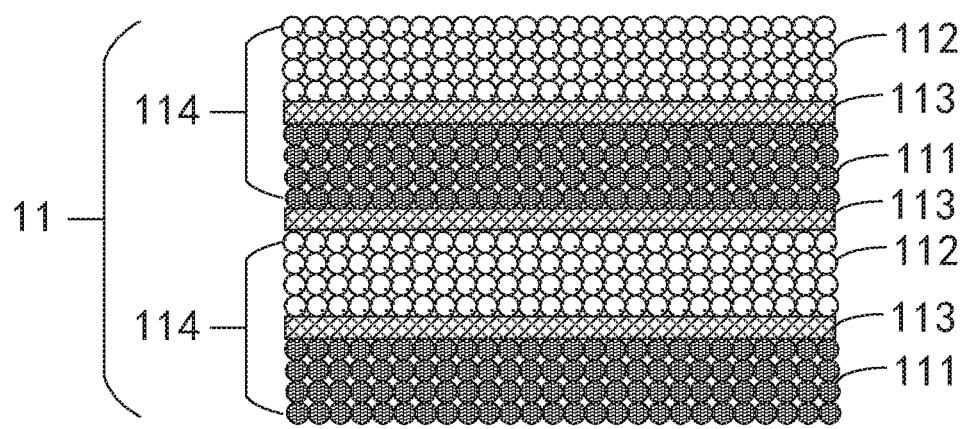
FIG. 1 is a schematic structural view of one embodiment of the inorganic film of the disclosure.

In order to clearly illustrate the film structure of the inorganic film of the disclosure, an explanation will be given by taking an inorganic film including two inorganic layer units as an example. Referring to FIG. 1, FIG. 1 is a schematic structural view of an inorganic film according to one embodiment of the disclosure.

Referring to FIG. 1, the inorganic film 11 includes two inorganic layer units 114, each inorganic layer unit 114 includes a first inorganic layer 111, a second inorganic layer 112, and a third inorganic layer 113 located between the first inorganic layer 111 and the second inorganic layer 112, and the third inorganic layer 113 is formed by reacting the first inorganic layer 111 with the second inorganic layer 112.

In the disclosure, the second inorganic layer 112 includes $ZrO_2$, and the first inorganic layer 111 includes a non-$ZrO_2$ oxide, such as a metal oxide or non-metal oxide of $Al_2O_3$, $SiO_2$, and $TiO_2$. The second inorganic layer 112 is located on the first inorganic layer 111.

Here, the first inorganic layer 111 including $Al_2O_3$ is taken as an example to describe a layer structure of the embodiment of the disclosure.

Due to the thickness ratio of $Al_2O_3$ and $ZrO_2$ having an influence on the water and oxygen blocking properties, the thickness of the first inorganic layer 111 in this embodiment ranges from 1 nm to 100 nm and the thickness of the second inorganic layers 112 ranges from 1 nm to 5 nm in order to further improve the ability of the inorganic film 11 to block the water and oxygen. In other embodiments, the specific thicknesses of the first inorganic layer 111 and the second inorganic layer 112 may be designed according to the actual situation.

In addition, the reaction occurs when $Al_2O_3$ and $ZrO_2$ contact to form a $ZrAlxOy$ phase. Therefore, the contact surface between the first inorganic layer 111 and the second inorganic layer 112 forms the third inorganic layer 113 with ultra-thinness and high density. The third inorganic layer 113 includes $ZrAlxOy$, which significantly improves the ability of blocking water and oxygen. Simultaneously, the third inorganic layer 113 is also formed between the two inorganic layer units 114.

Different from the prior art, the inorganic film in the disclosure includes the inorganic layer units including the first inorganic layer and the second inorganic layer, the first inorganic layer and the second inorganic layer react to form the third inorganic layer located between the first inorganic layer and the second inorganic layer. The inorganic film of the disclosure can obviously improve the water and oxygen blocking capability of the device and improve the product quality.

At present, the organic materials used in OLED devices are particularly sensitive to water and oxygen, so strict encapsulating materials are required to protect them from water and oxygen, especially in the field of flexible display. Typically, the OLED device is covered with a thin film encapsulation to protect the OLED device. The thin-film encapsulation adopts an alternation mode of inorganic-organic-inorganic, and the inorganic material is used to block the water and oxygen; The organic material such as acrylic, epoxy or silicone can effectively cover the particles and buffer the bending and folding stress.

The inorganic film of any one of the embodiments of the disclosure has a good ability of blocking water and oxygen and can form a specific encapsulating film as a barrier layer and a buffer layer containing organic materials to protect the OLED device from water and oxygen.

Figure 2:
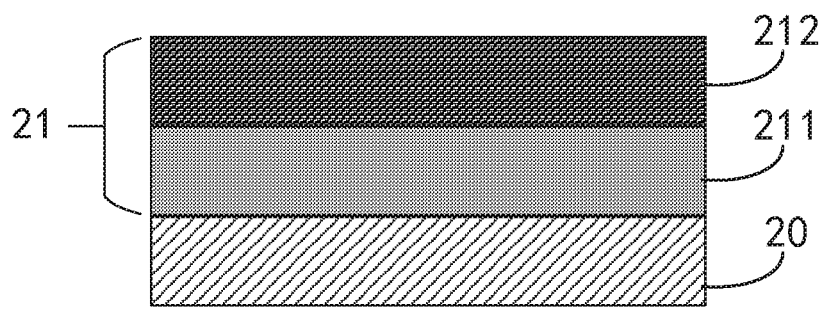
FIG. 2 is a schematic structural view of one embodiment of an encapsulating film of the disclosure.

In order to clearly illustrate the structure of the encapsulating film, referring to FIG. 2, FIG. 2 is a schematic structural view of an encapsulating film according to an embodiment of the disclosure.

In the disclosure, the OLED device 20 is covered with the encapsulating film 21, the encapsulating film 21 includes a buffer layer 212 and a barrier layer 211, and the first barrier layer 211 covers the OLED device 20 and the buffer layer 212 covers the first barrier layer 211.

The manufacturing process of the encapsulating film 21 is described below. The first barrier layer 211 is formed on the OLED device 20 by atomic deposition, and a buffer layer 212 is formed on the first barrier layer 211 by IJP, PECVD, ESC or Slit-nozzle coating, and the thickness of the buffer layer 212 ranges from 1 μm to 20 μm.

Here, the first barrier layer 211 in the disclosure includes the inorganic film in any one of the above embodiments. The structure of the inorganic film has been described in detail above, and will not be elaborated herein.

Figure 3:
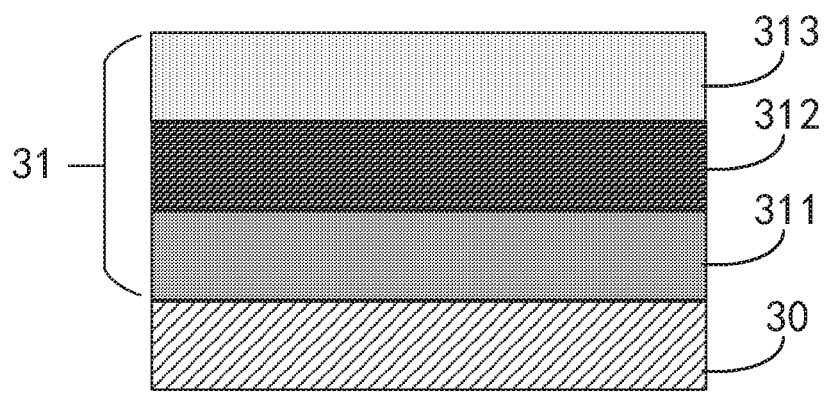
FIG. 3 is a schematic structural view of another embodiment of the encapsulating film of the disclosure.

Referring to FIG. 3, FIG. 3 is a schematic structural view of another embodiment of the encapsulating film of the disclosure. In the disclosure, the OLED device 30 is covered with the encapsulating film 31, the encapsulating film 31 includes a buffer layer 312, a first barrier layer 311, and a second barrier layer 313; the first barrier layer 311 covers the OLED device 30 and the buffer layer 312 covers the first barrier layer 311. The buffer layer 312 is also covered with the second barrier layer 313, and the first barrier layer 311 and the second barrier layer 313 have the same thickness and the same material. Simultaneously, the second barrier layer 313 can cover all the layers underneath.

The manufacturing process of the encapsulating film 31 is described below. The first barrier layer 311 is formed on the OLED device 30 by atomic deposition, and the buffer layer 312 is formed on the first barrier layer 311 by IJP, PECVD, ESC or Slit-nozzle coating, and the thickness of the buffer layer 312 ranges from 1 to 20 μm. Similarly, the second barrier layer 313 is formed on the buffer layer 312 by atomic deposition.

Both of the first barrier layer 311 and the second barrier layer 313 include the inorganic film in any one of the above embodiments.

In another embodiment, only one of the barrier layers included in the encapsulation film includes the inorganic film of any one of the above embodiments, and the remaining barrier layer is formed of a metal or a non-metal oxide, and the thickness of the barrier layer ranges from 10 nm to 1000 nm.

Figure 4:
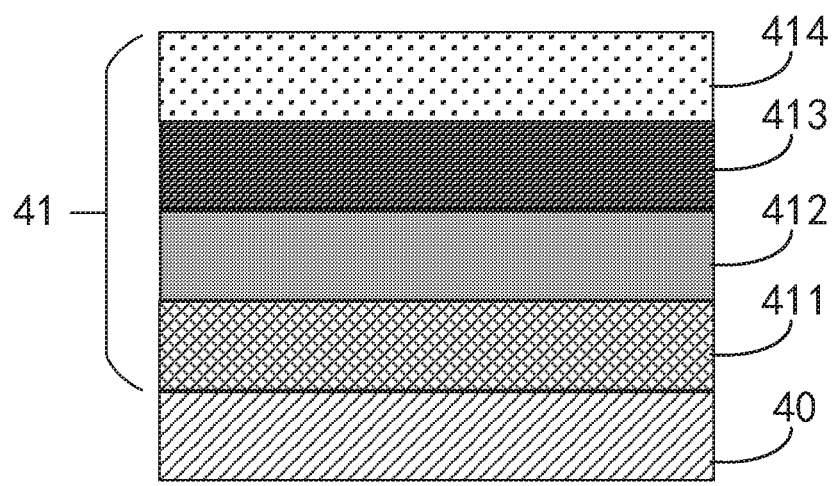
FIG. 4 is a schematic structural view of another embodiment of the encapsulating film of the disclosure.

Specifically, referring to FIG. 4, FIG. 4 is a schematic structural view of another embodiment of the encapsulating film of the disclosure. In the embodiment, the OLED device 40 is covered with an encapsulation film 41, and the encapsulation film 41 includes a buffer layer 413, a first barrier layer 412, a second barrier layer 414, and the third barrier layer 411. The first barrier layer 412 includes the inorganic film in any one of the above embodiments. Both the second barrier layer 414 and the third barrier layer 411 are formed of metal or non-metal oxide, and both have the same material and thickness.

The manufacturing process of the encapsulating film 41 is described below. The third barrier layer 411 is formed by using a method such as PLD, Sputter, and PECVD to deposit a layer of 10 nm-1000 nm metal or non-metal oxide on the OLED device 40; and the first barrier layer 412 is formed on the third barrier layer 411 by atomic deposition. Then, a buffer layer 413 is deposited on the first barrier layer 412 by IJP, PECVD, ESC or Slit-nozzle coating, and the thickness of the buffer layer 413 ranges from 1 to 20 μm. Finally, the second barrier layer 414 is formed on the buffer layer 413 by using PLD, Sputter, PECVD, and the like.

Different from the prior art, the inorganic film in the embodiment includes inorganic layer units including the first inorganic layer and the second inorganic layer, and the first inorganic layer and the second inorganic layer react to form the third inorganic layer between the first inorganic layer and the second inorganic layer. The inorganic film of the disclosure can obviously improve the water and oxygen blocking capability of the device and improve the product quality.

Above are only embodiments of the disclosure is not patented and therefore limit the scope of the disclosure, the use of any content of the present specification and drawings made equivalent or equivalent structural transformation process, either directly or indirectly related to the use of other technologies areas are included in the same way the scope of the patent protection of the disclosure.

What is claimed is:

1. An inorganic film, applied for thin film encapsulation of an OLED device, wherein the inorganic film comprises N inorganic layer units, wherein N is a natural number and N is not more than 10;
    wherein the inorganic layer units comprise a first inorganic layer, a second inorganic layer, and a third inorganic layer located between the first inorganic layer and the second inorganic layer,
    wherein the second inorganic layer comprises an oxide of a first element being $ZrO_2$ and the first inorganic layer comprises an oxide of a second element being one of $SiO_2$ and $TiO_2$;
    wherein the third inorganic layer is formed by reacting the oxide of the first element with the oxide of the second element and comprises an oxide including both of the first element and the second element.

2. The inorganic film according to claim 1, wherein a thickness of the first inorganic layer ranges from 1 nm to 100 nm and a thickness of the second inorganic layer ranges from 1 nm to 5 nm.

3. The inorganic film according to claim 1, wherein a thickness of the inorganic film ranges from 1 nm to 200 nm.

4. An inorganic film, applied for thin film encapsulation of an OLED device, wherein the inorganic film comprises inorganic layer units comprising a first inorganic layer, a second inorganic layer, and a third inorganic layer located between the first inorganic layer and the second inorganic layer, wherein the second inorganic layer comprises an oxide of a first element being a metal oxide, the first inorganic layer comprises an oxide of a second element being a non-metal oxide, and the third inorganic layer is made of an oxide including both of the first element and the second element.

5. The inorganic film according to claim 4, wherein the second inorganic layer comprises $ZrO_2$.

6. The inorganic film according to claim 5, wherein the first inorganic layer comprises $SiO_2$.

7. The inorganic film according to claim 4, wherein a thickness of the first inorganic layer ranges from 1 nm to 100 nm and a thickness of the second inorganic layer ranges from 1 nm to 5 nm.

8. The inorganic film according to claim 4, wherein a thickness of the inorganic film ranges from 1 nm to 200 nm.

9. The inorganic film according to claim 4, wherein a number of the inorganic layer units does not exceed 10.

10. An encapsulating film, applied for thin film encapsulation of an OLED device, wherein the encapsulating film comprises a buffer layer and a first barrier layer, the first barrier layer covers the OLED device, and the buffer layer covers the first barrier layer;
    wherein the first barrier layer comprises inorganic layer units comprising a first inorganic layer, a second inorganic layer, and a third inorganic layer located between the first inorganic layer and the second inorganic layer, wherein the second inorganic layer comprises an oxide of a first element being a metal oxide, the first inorganic layer comprises an oxide of a second element being a non-metal oxide, and the third inorganic layer is made of an oxide including both of the first element and the second element.

11. The encapsulating film according to claim 10, wherein the second inorganic layer comprises $ZrO_2$.

12. The encapsulating film according to claim 11, wherein the first inorganic layer comprises $SiO_2$.

13. The encapsulating film according to claim 10, wherein a thickness of the first inorganic layer ranges from 1 nm to 100 nm and a thickness of the second inorganic layer ranges from 1 nm to 5 nm.

14. The encapsulating film according to claim 10, wherein a number of the inorganic layer units does not exceed 10.

15. The encapsulating film according to claim 10, wherein the encapsulating film further comprises a second barrier layer, and the second barrier layer covers the buffer layer;
    wherein the second barrier layer comprises inorganic layer units comprising the first inorganic layer, the second inorganic layer, and the third inorganic layer located between the first inorganic layer and the second inorganic layer.

16. The encapsulating film according to claim 10, wherein the encapsulating film further comprises a second barrier layer, and the second barrier layer covers the buffer layer;
    wherein the second barrier layer comprises a metal or a non-metal oxide, and a thickness of the second barrier layer ranges from 10 nm to 1000 nm.

* * * * *